United States Patent
Pollard, II et al.

[19]

[11] Patent Number: 6,154,365
[45] Date of Patent: Nov. 28, 2000

[54] SPRING FIXTURE THAT ATTACHES A HEAT SINK TO A SUBSTRATE FOR MULTIPLE CYCLE ASSEMBLY/DISASSEMBLY

[75] Inventors: Lloyd Pollard, II, Portland, Oreg.; Chia-Pin Chiu, Chandler, Ariz.

[73] Assignee: Intel Corporation, Santa Clara, Calif.

[21] Appl. No.: 09/258,614

[22] Filed: Feb. 26, 1999

[51] Int. Cl.[7] ....................................................... H05K 7/20
[52] U.S. Cl. .......................... 361/704; 257/719; 361/710; 361/715
[58] Field of Search ................................. 165/80.2, 80.3, 165/185; 174/16.3; 257/706–707, 712–713, 718–719, 726–727; 361/704, 707, 709–710, 715

[56] References Cited

U.S. PATENT DOCUMENTS

| | | | |
|---|---|---|---|
| 5,262,925 | 11/1993 | Matta et al. | 257/718 |
| 5,483,103 | 1/1996 | Blickhan et al. | 257/718 |
| 5,838,542 | 11/1998 | Nelson et al. | 361/704 |
| 5,883,782 | 3/1999 | Thurston et al. | 257/718 |

*Primary Examiner*—Gregory Thompson
*Attorney, Agent, or Firm*—Blakely, Sokoloff, Taylor & Zafman LLP

[57] ABSTRACT

An electrical assembly which includes a heat sink that is pressed into an integrated circuit package by a spring fixture. The integrated circuit package is mounted to a substrate. Inserted through the spring fixture is a screw. The screw is also inserted through a clearance hole of the substrate and into an attachment hole of the heat sink to attach the heat sink to the substrate. Other features are disclosed.

16 Claims, 2 Drawing Sheets

SPRING FIXTURE THAT ATTACHES A HEAT SINK TO A SUBSTRATE FOR MULTIPLE CYCLE ASSEMBLY/DISASSEMBLY

BACKGROUND OF THE INVENTION

1. Field of the Invention

The present invention relates to a spring fixture that attaches a heat sink to a substrate for multiple cycle assembly/disassembly.

2. Background Information

Integrated circuit packages generate heat which must be removed from the circuits. To help remove this heat, these packages conventionally are thermally coupled to a heat sink. A heat sink typically contain a plurality of fins that extend from a pedestal having a mounting surface. This mounting surface mates with a corresponding surface of an integrated circuit package to form a mating surface. The mating surface must be relatively flat to insure that there are no air voids when the components are assembled. Air voids will significantly increase the thermal impedance between the heat sink and the integrated circuit package.

Stringent flatness requirements for individual parts of the electrical assembly increase the cost of producing the heat sink and the overall assembly. One known technique to reduce the stringent flatness requirements of the heat sink is to press the heat sink into the integrated circuit package by a clip having four L-shaped ears. U.S. patent application Ser. No. 09/110,539, filed on Jul. 6, 1998, owned by the assignee of this patent application, and entitled "An Electrical Assembly That Includes A Heat Sink Which Is Attached To A Substrate By A Clip" is directed to an electrical cartridge containing integrated circuit packages that employs a clip having four L-shaped ears to attach a heat sink to a substrate.

FIG. 1 shows an electrical assembly 10 of U.S. patent application Ser. No. 09/110,539. The electrical assembly 10 includes an electronic assembly 12 that includes an integrated circuit package 14 having a silicone integrated circuit (not shown). The integrated circuit package 14 is mounted to a substrate 16. The electrical assembly 10 further has a heat sink 18 that is mounted to the substrate 16. The heat sink 18 is pressed into the integrated circuit package 14 to provide a thermal path for the heat generated by the integrated circuit. The assembly 10 includes a clip 20 that attaches the heat sink 18 to the substrate 16.

The clip 20 is shown with four L-shaped ears 22 that are inserted through clearance holes 24 in the substrate 16 and corresponding attachment holes 26 in the heat sink 18. The four L-shaped ears 22 extend from a center plate portion 28. The L-shaped ears 22 are bent during insertion through the holes 24 and 26. Once beyond the attachment holes 26 of the heat sink 18, the L-shaped ears 22 snap back so as to permit the clip 20 to exert a spring force that pushes the heat sink 18 into the integrated circuit package 14.

However, from one electrical assembly 10 to the next, this spring force from L-shaped ears 22 is not consistent due to the variations within part manufacturing tolerances. Moreover, the L-shaped ear technique does not permit a worker to adjust the spring force from L-shaped ears 22 so as to evenly distribute this force over the surface of the substrate 16. Without an even distribution of force, the substrate 16 is more likely to bend which may cause the substrate 16 or the silicone integrated circuit within the integrated circuit package 14 to crack.

It would be desirable to provide an electrical assembly that permits even distribution of compression forces generated in pressing a heat sink into an integrated circuit package.

SUMMARY OF THE INVENTION

One embodiment of the present invention is an electrical assembly which includes a heat sink that is pressed into an integrated circuit package by a spring fixture. The integrated circuit package is mounted to a substrate. Inserted through the spring fixture is a screw. The screw is also inserted through a clearance hole of the substrate and into an attachment hole of the heat sink to attach the heat sink to the substrate. Other features are disclosed.

DETAILED DESCRIPTION OF THE INVENTION

Figure 1:
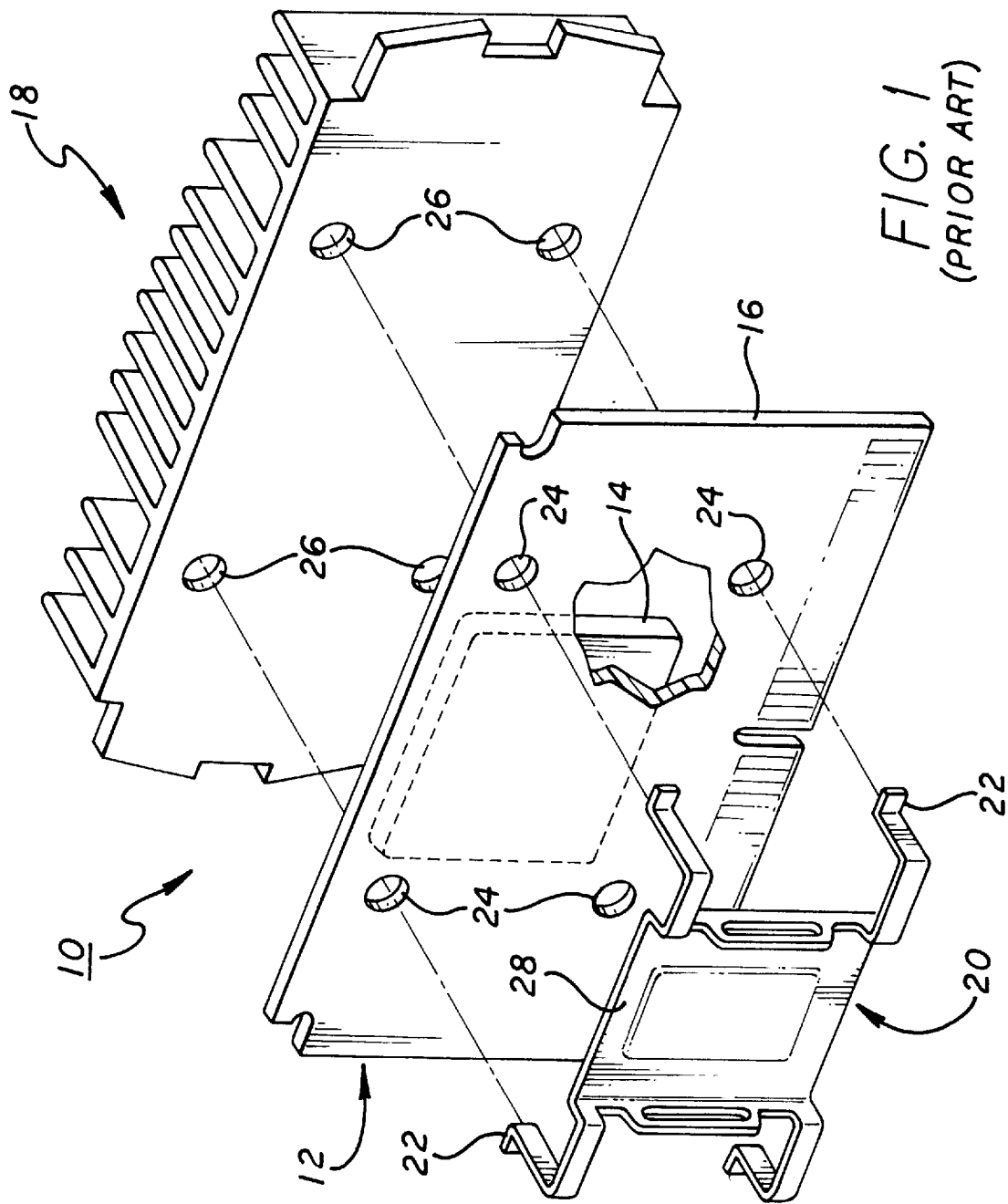
FIG. 1 is a perspective view of an electrical assembly of the prior art.
Figure 2:
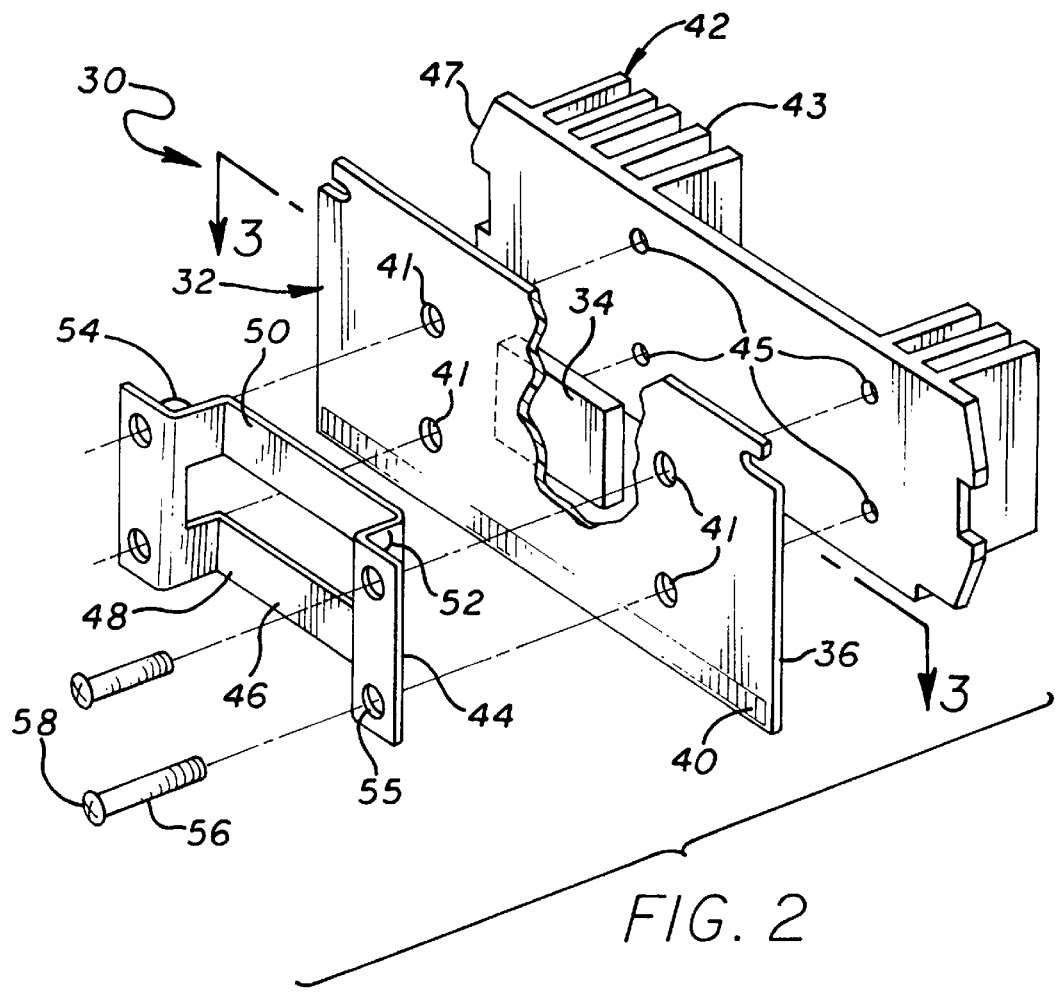
FIG. 2 is a perspective view of an embodiment of an electrical assembly of the present invention.

Referring to the drawings more particularly by reference numbers, FIG. 2 is a perspective view of an embodiment of an electrical assembly of the present invention. The electrical assembly 30 may include an electronic assembly 32 having an integrated circuit package 34 that is mounted to a substrate 36. The integrated circuit package 34 may contain an integrated circuit (not shown) such as a microprocessor. The integrated circuit package 34 may be an organic land grid array (OLGA) (exposed die) package. The substrate 36 may be a printed circuit board. One edge of the substrate 36 may have a plurality of contacts 40 that can be inserted into an electrical connector (not shown). The substrate 36 may have routing traces, power/ground planes, vias, surface pads, etc. that electrically connect the integrated circuit package 34 to the plurality of contacts 40. In addition, the substrate 36 may have four clearance holes 41.

The electrical assembly 30 may further have a heat sink 42 that is mounted to the substrate 36. The heat sink 42 may have fins 43 that extend from a pedestal 47, four attachment holes 45, and may be pressed into the integrated circuit package 34 to provide a thermal path for the heat generated by the integrated circuit. The heat sink 42 may have eight or more fins 43. The four attachment holes 45 may be threaded. A thermal grease (not shown) may be placed between the heat sink 42 and the integrated circuit package 34. The electrical assembly 30 may include a spring fixture 44 that attaches the heat sink 42 to the substrate 36.

The spring fixture 44 may have a center plate portion 46 that is made up of leaf 48 and leaf 50. Leaf 48 and leaf 50 may be coupled between a spring 52 and a spring 54. As shown in FIG. 2, spring 52 and spring 54 each have two holes 55. Each screw may be threaded and have a phillips head 58. Moreover, a bolt and washer combination may also be used for screw 56. A screw 56 may be inserted through each hole 55.

Figure 3:
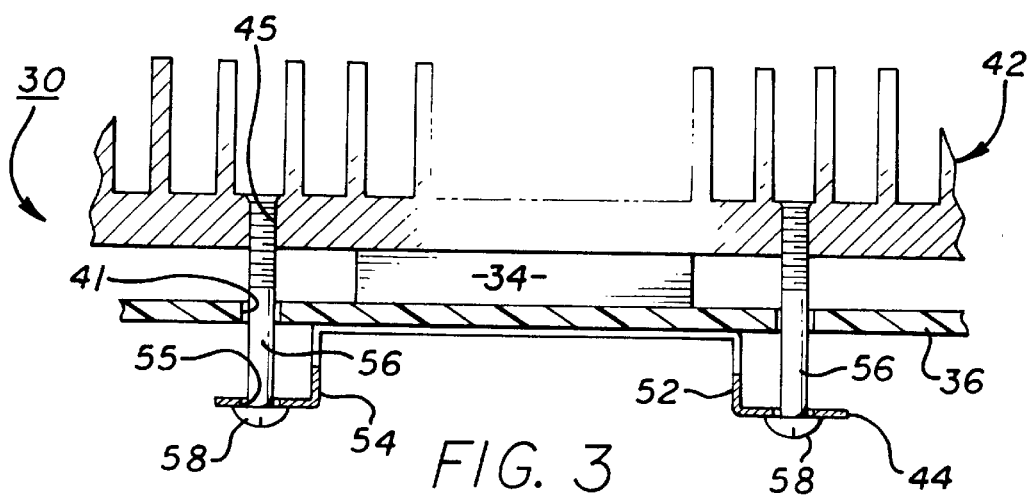
FIG. 3 is a sectional view taken generally on line 3—3 of FIG. 2 in the assembled condition.

FIG. 3 is a sectional view taken generally on line 3—3 of FIG. 2 in the assembled condition. Referring to FIG. 3, the electrical assembly 30 is assembled by mounting the integrated circuit package 34 to the substrate 36. The integrated circuit package 34 is engaged to the heat sink 42 and the spring fixture 44 is engaged to the substrate 36. To attach the heat sink 42 to the substrate 36, each screw 56 is inserted through hole 55 of the spring fixture 44, through the clearance hole 41, and into the attachment hole 45. When assembled, the spring fixture 44 may exert a compression force that pushes the heat sink 42 into the integrated circuit package 34.

As each screw 56 is tightened, spring 52 and spring 54 will tend to deform. As spring 52 and spring 54 deform, the compressive load on the heat sink 42 and the integrated circuit package 34 will increase proportionately to the deformation. By adjusting the tightening of each screw 56, the compression force may be evenly distributed within the substrate 36 so as to avoid damaging the parts of the electrical assembly 30. The spring fixture 44 may be removed by untightening each screw 56.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An assembly comprising:
   a substrate which has a clearance hole;
   an integrated circuit package mounted to the substrate;
   a heat sink that has an attachment hole;
   a spring fixture that has a fixture hole and a center plate portion comprised of a plurality of leaves, each leaf having a first end and a second end, each first end coupled to a first spring and each second end coupled to a second spring; and
   a screw for fastening, wherein the screw extends through the fixture hole, through the clearance hole, and into the attachment hole which attaches the heat sink to the substrate.

2. The assembly as recited in claim 1, wherein the spring fixture exerts a spring force that presses the heat sink into the integrated circuit package.

3. The assembly as recited in claim 1, wherein the center portion has two leaves.

4. The assembly as recited in claim 1, wherein the heat sink has a plurality of fins that extend from a pedestal.

5. The assembly as recited in claim 4, wherein the heat sink has at least eight fins.

6. The assembly as recited in claim 1, further comprising a thermal grease that is located between the heat sink and the integrated circuit package.

7. The assembly as recited in claim 1, wherein the assembly has four screws, the spring fixture has four holes, the substrate has four clearance holes, and the heat sink has four attachment holes.

8. The assembly as recited in claim 7, wherein each screw is threaded.

9. The assembly as recited in claim 8, wherein each attachment hole is threaded.

10. The assembly as recited in claim 8, wherein each screw is a phillips head screw.

11. A method for assembling an assembly, comprising:
    mounting an integrated circuit package to a substrate, the substrate having a clearance hole;
    attaching the integrated circuit package to a heat sink, the heat sink having an attachment hole;
    attaching a spring fixture to the substrate, the spring fixture having a fixture hole and a center plate portion, the center plate portion has two leaves, each leaf having a first end and a second end, each first end coupled to a first spring and each second end coupled a second springs; and
    inserting a screw through the fixture hole, the clearance hole and the attachment hole.

12. The method as recited in claim 11 wherein the screw is threaded.

13. The method as recited in claim 12, wherein the assembly has four screws, the method further comprising adjusting the tightening of each screw to evenly distribute the compression force within the substrate.

14. The method as recited in claim 13, wherein mounting an integrated circuit package to a substrate further comprising spreading a thermal grease on the integrated circuit package.

15. The method as recited in claim 11 further comprising exerting a spring force that presses the heat sink into the integrated circuit package.

16. The method as recited in claim 15 further comprising locating a thermal grease between the heat sink and the integrated circuit package.

* * * * *